United States Patent [19]

Kondo et al.

[11] Patent Number: 5,075,762
[45] Date of Patent: Dec. 24, 1991

[54] SEMICONDUCTOR DEVICE HAVING AN INTER-LAYER INSULATING FILM DISPOSED BETWEEN TWO WIRING LAYERS AND METHOD OF MANUFACTURING THE SAME

[75] Inventors: Toshihiko Kondo; Kazuo Tanaka, both of Suwa, Japan

[73] Assignee: Seiko Epson Corporation, Tokyo, Japan

[21] Appl. No.: 202,649

[22] Filed: Jun. 7, 1988

[30] Foreign Application Priority Data

| Jun. 9, 1987 | [JP] | Japan | 62-143717 |
| Jun. 12, 1987 | [JP] | Japan | 62-145297 |
| Nov. 4, 1987 | [JP] | Japan | 62-278566 |
| Feb. 24, 1988 | [JP] | Japan | 63-41253 |

[51] Int. Cl.$^5$ .................. H01L 29/78; H01L 29/68
[52] U.S. Cl. .................. 357/71; 357/23.6; 357/23.1; 357/23.5; 357/59; 357/68
[58] Field of Search ............ 357/68, 59, 23.3, 23.5, 357/23.6, 232.1, 71

[56] References Cited

U.S. PATENT DOCUMENTS

| 4,654,680 | 3/1987 | Yamazaki | 357/23.3 |
| 4,663,645 | 5/1987 | Komori et al. | 357/23.3 |
| 4,807,002 | 2/1989 | Donzelli | 357/23.1 |
| 4,808,544 | 2/1989 | Matsui | 357/23.3 |
| 4,823,172 | 4/1989 | Mihara | 357/13 |
| 4,845,544 | 7/1989 | Shimizu | 351/23.6 |
| 4,855,801 | 8/1989 | Kuesters | 351/23.5 |

OTHER PUBLICATIONS

"An 80ns 1Mb ROM" by Fujio Masuoka, et al., 1984 IEEE International Solid-State Circuits Conference, pp. 146, 147 and 329.

"4M Bit Mask ROM And The Application Therefore", by Shoichi-Tsujita Electronic Parts and Materials, published 1/1/86, pp. 104-108.

Primary Examiner—Andrew J. James
Assistant Examiner—Viet Q. Nguyen
Attorney, Agent, or Firm—Blum Kaplan

[57] ABSTRACT

A MOS semiconductor device and method for manufacturing the device includes a semiconductor substrate, a first insulating film formed on the substrate, and a first wiring layer which is formed on, and to lesser width than, the first insulating film. A second insulating film is formed on the first wiring layer. A side wall insulating film is formed on side walls of the first wiring layer and of the second insulating film. The sidewall insulating film is formed in such a manner as to have progressively larger width as the side wall insulating film comes closer to the semiconductor substrate. A second wiring layer is formed in such a manner as to extend from above the first wiring layer, which it is spaced by the second insulating film, to an exposed surface of the semiconductor substrate. The latter exposed surface is situated in proximity to, but laterally spaced from, the first wiring layer. The second insulating film and the side wall insulating film serve as an interlayer insulating film.

42 Claims, 6 Drawing Sheets (a)

(b)

(c)

(a)

(b)

(c)

SEMICONDUCTOR DEVICE HAVING AN INTER-LAYER INSULATING FILM DISPOSED BETWEEN TWO WIRING LAYERS AND METHOD OF MANUFACTURING THE SAME

CROSS REFERENCE TO RELATED APPLICATIONS

This application is a continuation-in-part of U.S. patent application Ser. No. 07/360,611 filed June 2, 1989, which has issued as U.S. Pat. No. 4,931,996 on June 5, 1990, which is a continuation of U.S. patent application Ser. No. 07/114,311, filed Oct. 27, 1987, now abandoned.

BACKGROUND OF THE INVENTION

The present invention relates to a semiconductor device and, more particularly, to metal-oxide-silicon (MOS) and metal-insulator-silicon (MIS) semiconductor devices having an LDD (lightly doped drain) structure and a method of manufacturing such a semiconductor device.

The structure of a conventional MOS semiconductor device and the contact portion thereof are shown in FIGS. 1 and 2, respectively. and the manufacturing process for a semiconductor device having an LDD structure is shown in FIGS. 3(a) to 3(e).

In these drawings, the MOS semiconductor device depicted includes a silicon (Si) substrate 1 having a surface-adjacent diffusion layer 2 formed therein. The layer 2 constitutes a source region or a drain region. The diffusion layer 2 is formed to a low-concentration region 2a and a high-concentration region 2b. Overlying the substrate 1 is a gate insulating film 4 and thereabove a gate electrode 3. Also depicted are an interlayer insulating film 10 which generally overcovers the components lying thereunder, namely side wall 6 and a first wiring layer 7 (FIG. 2), the gate electrode 3, and the underlying gate insulating film 4. A second wiring layer 8 overlies the interlayer insulating film 5; the second wiring layer 8, through an opening 9 in the interlayer insulating film 10, penetrates to and contacts the major surface of the semiconductor substrate 1 at the diffusion layer region 2 thereof. The side wall 6 is formed on either side of gate electrode 3 on gate insulating film 4. The gate insulating film 4 is supported on the substrate 1 in such manner that the gate electrode 3 overspans diffusion layers 2.

By an LDD structure, generally speaking, is meant a structure in which the diffusion layer 2 is composed of a region 2a having a low concentration and a region 2b having a high concentration, as shown in FIG. 1. The low concentration of the region 2a prevents the diffusion layer 2 from extending to the region in which a channel is to be formed, namely, to the portion under the gate insulating film 4, thereby definitively establishing the channel length.

The LDD structure, in which the region 2a increases the resistance of the portion under the gate insulating film 4, relaxes the electric field produced in the vicinity of the drain, thereby suppressing the deterioration of the characteristics of the metal insulator semiconductor field effect transistor (hereinunder referred to as "MISFET"). Specifically, a certain fluctuation in threshold value is suppressed. That fluctuation occurs when carriers are injected and captured in the gate insulating film 4; in their words, the so-called hot carrier phenomenon is suppressed. A conventional manufacturing process for a semiconductor device having a LDD structure will now be described with reference to FIGS. 3(a) to 3(e).

As shown in FIG. 3(a), a gate insulating film layer 4 is first formed on the substrate 1 by a conventional method. Then the gate electrode 3 is formed on the gate insulating film 4 by a conventional method. The diffusion layer 2a having a low concentration is next formed, as shown in FIG. 3(b). Then, as shown in FIG. 3(c), the interlayer insulating film 6a is formed. The side wall 6 is to be defined from the interlayer insulating film 6a. Next, as shown in FIG. 3(d), the side wall 6 is formed by anisotropic etching of the interlayer insulating film 6a. Finally, the diffusion layer 2b having a high concentration is formed, as shown in FIG. 3(e).

Such an LDD structure increases, and in this sense improves, the breakdown voltage which the semiconductor structure should withstand. Another advantageous effect is reduction in the above discussed fluctuation of the threshold value. The reduction is significant, so that the reliability of the transistor is greatly improved.

Japanese Patent Laid-Open No. 68776 (1976) discloses a MISFET having one conductivity type of source region and drain region formed on a semiconductor substrate of the opposite conductivity type. The drain region consists of a central portion having a high surface impurity concentration, and of a low impurity concentration portion which surrounds the central portion. That is, this MISFET adopts a double drain structure in order to relax the electric field produced in the vicinity of the drain region and to prevent the fluctuation of the threshold value due to the hot carrier phenomenon.

Japanese Patent Laid-Open No. 194568 (1985) discloses an integrated circuit (IC) provided with a MISFET which is capable of definitively establishing the effective channel length of the MISFET, thereby preventing the so-called short channel effect. In this manner, the degree of integration of the IC is improved, and the speed of the operation time is increased. For these purposes, the IC is composed of a semiconductor substrate which contains the impurities for constituting the drain region and the source region, respectively. These regions consist of two semiconductor regions of the same conductivity type but having different impurity densities. The impurities are introduced through the gate electrode and the side wall provided on both sides thereof as a mask. This prevents extension of the source region or the drain region to that region in which a channel is to be formed thus and definitively establishes the effective channel length.

Japanese Patent Laid-Open No. 20369 (1986) discloses a method of forming an LDD type semiconductor device. This method comprises the following steps. A gate insulating film is formed on a semiconductor substrate surrounded by a device isolation device region, and a gate electrode is formed on the gate insulating film. Then there is formed a first impurity layer of the second conductivity type by introducing impurities to the substrate while using the gate electrode as a mask. An insulating film is deposited on the entire surface; portions of the insulating film are removed by reactive ion etching but in such a manner as to retain the film on the side surface of the gate electrode and in the vicinity thereof. A second impurity layer of the second conductivity type is formed by introducing impurities to the substrate while using the gate electrode and the remaining insulating film as a mask so as to form source and drain regions. A mask material layer is formed so as to have a selective etching property with respect to the insulating film on the entire surface. The mask material layer is selectively removed until a part of the remaining insulating film on the side surface of the gate electrode is exposed. The remaining insulating film is selectively removed by using the remaining mask material layer so as to form a gap portion between the insulating film and the gate electrode. Impurities are introduced to the substrate from the gap so as to form a third impurity layer of the first conductivity type (e.g. a P⁻ type layer).

The purpose for partially forming the third impurity layer of the first conductivity type is to suppress an extension of the depletion layer. That extension would otherwise be induced by the drain voltage in that region of the substrate which is of the first conductivity type and is in the vicinity of the side wall of the gate electrode As a result the contact portion of the P⁻ type layer which contains the source and drain regions is reduced in comparison with still earlier prior art.

The above-described conventional MOS semiconductor devices, however, have the following problems and shortcomings.

(1) As shown in FIG. 2, the contact portion between the wiring layer 8 and diffusion layer 2 constitutes a hole-like opening portion of length l. Typically in the prior art, an alignment allowance a for photolithography is necessary in order to prevent short circuiting of the first wiring layer 7 and the second wiring layer 8 through the opening portion 9. Since the alignment allowance a is determined by the performance of an exposing device, it cannot be simply reduced. Thus, this is an obstacle to large scale integration.

(2) For a similar reason to that of (1), the alignment allowance a adds to the length of the second wiring layer 8; the additional length introduces resistance which delays propagation and makes speed-up of the operation well-nigh impossible.

(3) For a similar reason to that of (1), the alignment allowance a adds to the parasitic diffusion capacitance, thereby making speed-up of the operation well-nigh impossible.

Accordingly, there is a need to speed-up the operation of the semiconductor device by reducing wiring layer resistances and parasitic diffusion capacitance, and to provide manufacturing methods which will assure achievement of such reductions in resistance and capacitance. Further, it is required to render the IC chip area small.

SUMMARY OF THE INVENTION

The invention is generally directed to a semiconductor device which comprises a semiconductor substrate. A first insulating film is carried by the major surface, and a first wiring layer is carried by the first insulating film; the first wiring layer has lesser width than the first insulating film. An interlayer insulating film is provided, and is arranged in a plurality of portions. A first top portion thereof overlies the first wiring layer, and together with generally vertically oriented or side wall portions enclose and overcover the first wiring layer. The vertically oriented portions of the interlayer insulating film progressively increase in width in progressing toward the substrate. The interlayer insulating film is provided with a second top portion which overcovers on one side of the semiconductor device, the aforementioned portions of the interlayer insulating film and also the adjacent exposed portion of the surface of the semiconductor substrate. The corresponding portions on the other side of the semiconductor device are left not covered by the second top portion of the interlayer insulating film. A second wiring layer, in contact with the surface of the substrate at the first-mentioned side of the semiconductor device, overlies the second top portions of the interlayer insulating film.

A diffusion-layer-region is provided in the substrate on each of the mentioned two sides of the semiconductor device, one diffusion-layer-region being at least in part covered by the second top portion of the interlayer insulating film, the other being at least in part covered by the second wiring layer. The latter diffusion-layer-region, as well as the related portion of the substrate and the overcovering second wiring layer may be considered as being in-common to a first and second such semiconductor device. The second wiring layer of the first semiconductor device couples with the second wiring layer of the second semiconductor device by extending over the second top portion of the interlayer insulating film. The opening in the interlayer insulating film which defines the second top portion thereof is wider than the underlying, incommon diffusion layer region Accordingly, it is an object of the present invention to provide a semiconductor device which eliminates the above-described problems in the prior art and a method of manufacturing such a semiconductor device.

It is another object of the present invention to prevent an alignment deviation between the first wiring layer 7 (gate electrode 3) and the opening portion 9, which would otherwise be produced by photolithography, and would bring about increase in contact resistance.

It is still another object of the invention to virtually eliminate the requirement for alignment allowance.

Yet another object of the present invention is to minimize the width of the wiring interval.

A still further object of the invention is to restrict the width of the wiring interval to that required by fabrication necessity.

It is yet another object of the invention to provide a semiconductor device, and method of manufacture thereof, which are essentially free from introduction of new problems which might otherwise be engendered by the new approaches utilized by the invention.

The above and other objects, features and advantages of the present invention will become clear from the following description of the preferred embodiments thereof, taken in conjunction with the accompanying drawings The invention accordingly comprises the features of construction, combination of elements, and arrangement of parts which will be exemplified in the construction hereinafter set forth, and the scope of the invention will be indicated in the claims. The claims and the Abstract shall be deemed to be part of the specification

BRIEF DESCRIPTION OF THE DRAWINGS

For a fuller understanding of the invention, reference is had to the following description taken in connection with the accompanying drawings in which.

DESCRIPTION OF THE PREFERRED EMBODIMENTS

Embodiments of a semiconductor device according to the present invention will now be explained with reference to the accompanying drawings.

FIRST EMBODIMENT (SEMICONDUCTOR STRUCTURE)

An example of an embodiment of a semiconductor device according to the present invention which is applied to an IC provided with an N channel type MISFET will be explained.

Figure 4:
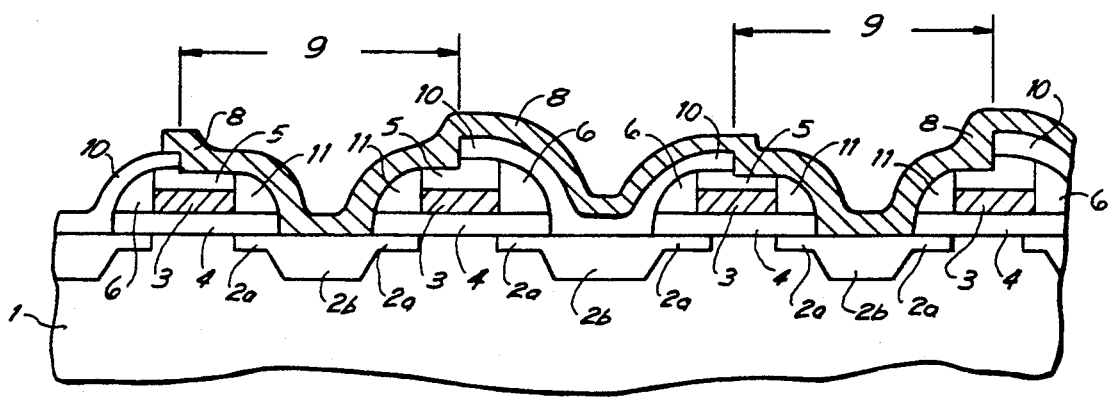
FIG. 4 is a sectional view of the main part of an embodiment of a semiconductor device according to the present invention.
Figure 5:
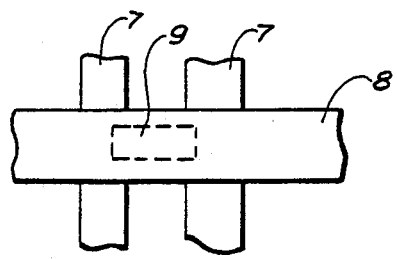
FIG. 5 is a plan view of the contact portion of the embodiment shown in FIG. 4.
Figure 6:
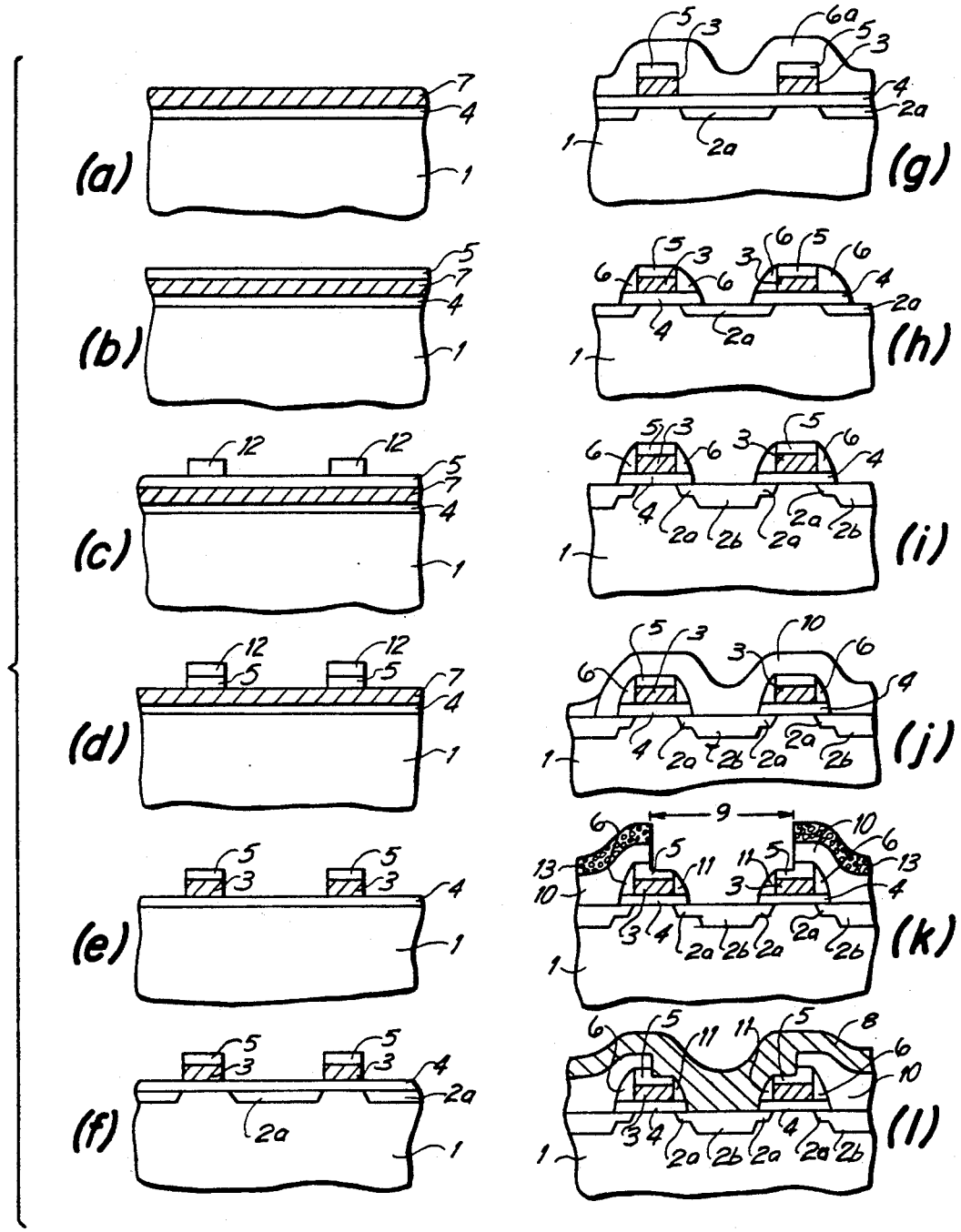
FIGS. 6(a) to 6(l), 7(a) to 7(c), 8(a) to 8(c), 9(a) to 9(d) are respectively explanatory views of embodiments of a manufacturing method according to the present invention.

FIGS. 4 and 5 are respectively explanatory views of a semiconductor device according to the present invention and the contact portion thereof.

In FIGS. 4 and 5, the same numbers are provided for the same elements as those shown in FIGS. 1 to 3(e), and repetitious explanation thereof will be omitted.

Figure 1:
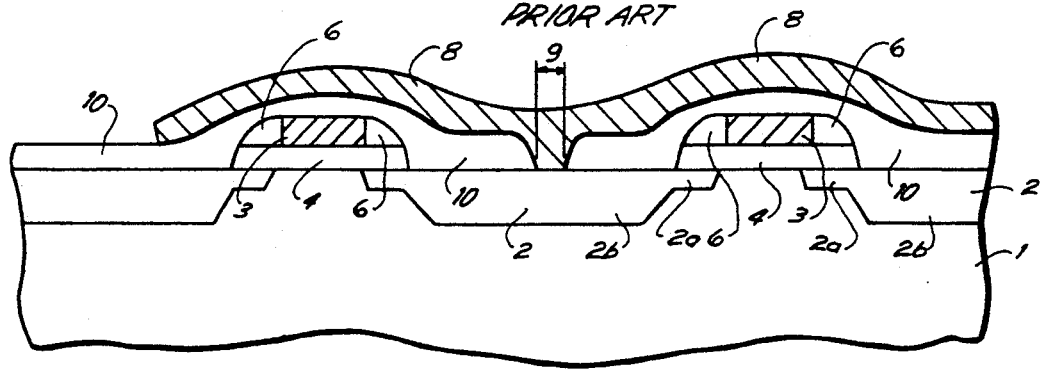
FIG. 1 is a sectional view of the structure of a conventional semiconductor device.

In FIG. 4, the substrate 1 consists of a P− type semiconductor substrate or a P− region formed on an N− type semiconductor substrate consisting of a single crystal of silicon, as in FIG. 1, and, together with the other elements, defines an IC. Diffusion layers 2 constitutes N+ type source and drain regions. As before, there are provided a diffusion layer 2a having a low concentration and a diffusion layer 2b having a high concentration. A first wiring layer 3 is formed on the upper surface of the insulating film 4 so as to be mainly used as a gate electrode. The gate electrode 3 is composed of polycrystalline silicon, a high-melting metal such as Mo, W, TiSi$_2$ Ti and Pt, a silicide of a high-melting metal such as MoSi$_2$, WSi$_2$, TiSi$_2$ a polysilicide consisting of polycrystalline silicon with a silicide of a high-melting metal formed thereon, and the same will be applied to the gate electrode in the following embodiments. An insulating film 4 is formed of SiO$_2$ obtained by the thermal oxidation of the substrate 1 and is provided on the substrate 1 so as to be mainly used as a gate insulating film. As before, there is provided an interlayer insulating film 5 of SiO$_2$, Si$_3$N$_4$ or the like. The film 5 is situated above the substrate 1 in such a manner as to cover the semiconductor device. Thus, the interlayer insulating film 5 serves mainly to electrically isolate the second wiring layer of Al, Al-Si, Al-Si-Cu or the same material as that of the first wiring layer 7(3). Therefore, the formation of the interlayer insulating film 5 is most important in the present invention and it will be explained in detail in an embodiment of a manufacturing method which will be described later. For the interlayer insulating film 5, an SiO$_2$ film formed by thermal oxidation or CVD (Chemical Vapor Deposition) and an Si$_3$N$_4$ film formed by CVD are used. As before, an insulating side wall 6 of SiO$_2$, Si$_3$N$_4$ or the like is provided mainly on the gate insulating film 4 at both end portions of the gate electrode 3 of the first wiring layer. The side wall 6 is produced by anisotropic etching. The side wall 6 isolates a pair of semiconductor regions which are used as the drain region and the source region. Such isolation serves to assure a sufficient effective channel length and insures that the diffusion layer 2a which is formed at this time, shall have a low concentration. An interlayer insulating film 10 of SiO$_2$, Si$_3$N$_4$ or the like between the first wiring layer 7(3) and the second wiring layer 8. A side wall insulating film 11 of SiO$_2$, Si$_3$N$_4$ or the like is provided on the gate insulating film 4 by anisotropic etching so as to insulate the side wall of the gate electrode 3 within the opening at which the second wiring layer 8 comes into contact with the diffusion layer 2 in the substrate. The side wall insulating film 11 assumes three different states depending on the thickness of the interlayer insulating film 10 and the length of the overetching time for etching the interlayer insulating film 10. The first state is as a side wall of an LDD structure; the second state is as a side wall insulating film which is formed by the same mechanism as the side wall itself when the interlayer insulating film 10 is anisotropically etched to form the opening portion (represented by the numeral 9 in FIG. 5), and the third state is a side wall insulating film which is formed by a combination of the first state and the second state.

More specifically, when the overetching time is long, the entire part of the interlayer insulating film 10 is etched even on the side surface of the gate electrode 3, so that the side wall insulating film 11 becomes the side wall of an LDD structure (the first state). On the other hand, if the etching amount is reduced, the side wall insulating film 11 assumes the third state. The side wall insulating film 11 assumes the second state when a semiconductor device is fabricated by the process shown in the later-described third embodiment.

The semiconductor device according to the present invention is different from a conventional semiconductor device in the following points, as shown in FIGS. 4 and 5.

(1) The second wiring layer 8 is separated from the first wiring layer 7 (gate electrode 3) by the side wall 11, as if by self alignment at that portion on the substrate 1 at which the second wiring layer 8 comes into contact with the diffusion layer 2.

(2) Since the opening portion 9 is wider than the width of the diffusion layer 2a, 2b of the source or drain region and the side wall 11, as shown in FIG. 5, no alignment allowance a is provided. Although the alignment allowance a can be eliminated in the stage of pattern layout, an alignment deviation exists between the first wiring layer 7(3) and the opening portion 9 at the time of photolithograph. Such an alignment deviation reduces the substantial contact area between the second wiring layer 8 and the diffusion layer 2 in the opening portion 9 and thereby increases the contact resistance. To eliminate this inconvenience, the opening portion 9 is provided in such a manner as to extend to a position above the first wiring layers 7 and 3, to a width greater than that of the underlying diffusion layer region.

(3) The first wiring layers 7 and 3 and the second wiring layer 8 are separated by the insulating film 5 as well as by the conventional interlayer insulating film 10.

SECOND EMBODIMENT (METHOD OF MANUFACTURE)

An embodiment of a method of manufacturing a semiconductor device according to the present invention will be described with reference to FIGS. 6(a) to 6(l).

In these drawings, the reference numeral, 13 represents a photoresist pattern.

The manufacturing method of this embodiment comprises the following twelve steps.

(1) The gate insulating film 4 is first formed on the surface of a P− type semiconductor substrate 1. Thereafter a gate electrode layer 7 is formed on the gate insulating film 4, as shown in FIG. 6(a). The layer 7 consists of a polycrystalline silicon layer, a layer of a high-melting metal such as Mo, W, Ti and Pt, a layer of a silicide of a high-melting metal such as $MoSi_2$, $WSi_2$ and $TiSi_2$, or a polysilicide layer consisting of a combination of two layers thereof.

(2) The insulating film 5 of $SiO_2$, $Si_3N_4$ or the like is next formed on the gate electrode layer 7 by CVD, as shown in FIG. 6(b). In this case, the film of $SiO_2$ or $Si_3N_4$ or the like may be formed by the thermal oxidation, nitriding or the like of a part of the gate electrode layer 7.

(3) The photoresist pattern 12 is formed on the insulating film 5, as shown in FIG. 6(c).

(4) The insulating film 5 is removed by reactive ion etching (RIE), as shown in FIG. 6(d).

(5) The gate electrode 3 is then formed by reactive ion etching, as shown in FIG. 6(e), and the photoresist pattern 12 is removed, thereby selectively forming the insulating film 5 on the gate electrode 3.

(6) An n− layer (diffusion layer 2a having a low concentration) is formed on the substrate 1 by the implantation of $^{31}P^+$ or $^{75}As^+$ ions while using the gate electrode 3 and the insulating film 5 as a mask, as shown in FIG. 6(f).

(7) The interlayer insulating film 6a of $SiO_2$, $Si_3N_4$ or the like is formed over the entire surface of the gate electrode 3 by CVD, as shown in FIG. 6(g).

(8) The entire surface of the layer insulating film 6a is removed by reactive ion etching so as to form the side wall 6 of $SiO_2$, $Si_3N_4$ or the like on the side wall of the gate electrode 3, as shown in FIG. 6(h).

(9) An n+ layer (diffusion layer 2b having a high concentration) is formed on the substrate 1 by the implantation of $^{31}P^+$ or $^{75}As^+$ ions, as shown in FIG. 6(i).

(10) The interlayer insulating film 10 of $SiO_2$, $Si_3N_4$ or the like is formed by CVD, as shown in FIG. 6(j).

(11) A part of the interlayer insulating film 5 and a part of the side wall 6 underlying a portion of the interlayer insulating film 10 are removed. Removal is by etching so as to form the side wall 11 and the opening portion 9 at the contact portion while using a photoresist pattern 13 as a mask, as shown in FIG. 6(k).

At this time optimizations are effected, namely optimization of the thickness of the insulating film 5, optimization of the amount of overetching of the interlayer insulating film 6a when the side wall 6 is formed and optimization of the etching condition of the interlayer insulating film 10 for forming the opening portion 9 at the contact portion. The objective of the optimizations is to adjust the thickness of the-interlayer insulating film 5 or 11 between the first wiring layer 7 and 3 and the second wiring layer 8 to not less than 500 Å at the thinnest portion, whereby the leakage between the first wiring layers 7 and 3 and the second wiring layer 8 is prevented and adequate breakdown voltage value is assured.

(12) Finally, the second wiring layer 8 is formed from a film of Al, an Al alloy such as Al, Al-si and Al-Si-Cu or the same material as that of the first wiring layer 7, 3 by a conventional method, as shown in FIG. 6(l).

A semiconductor device having the structure in accordance with the present invention was produced by executing the above-described twelve steps.

THIRD EMBODIMENT (MANUFACTURING METHOD)

Another embodiment of a manufacturing method of the present invention will be described with reference to FIGS. 7(a) to 7(c).

(1) The gate insulating film 4 is first formed on the surface of a P− type semiconductor substrate 1. Thereafter the gate electrode 3 is formed on the gate insulating film 4 on substrate 1, as shown in FIG. 7(a). The gate electrode 3 consists of a polycrystalline silicon layer, a high-melting metal layer such as Mo, W, Ti and Pt, a layer of silicide of high-melting metal such as $MoSi_2$, $WSi_2$ and $TiSi_2$ or a polysilicide layer consisting of a combination of two layers thereof.

Figure 7:
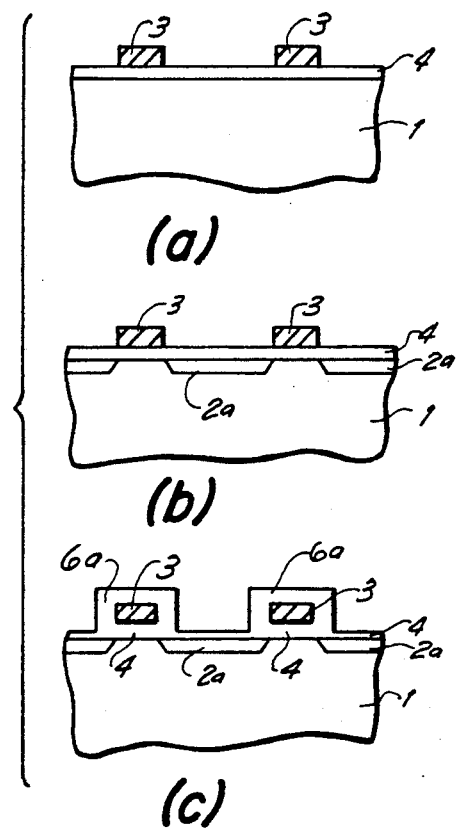

(2) An n− layer (diffusion layer 2a having a low concentration) is formed on the substrate 1 by the implantation of $^{31}P^+$ or $^{75}As^+$ ions while using the gate electrode 3 as a mask, as shown in FIG. 7(b).

(3) The thus-treated substrate 1 is subjected to oxidization at a temperature of not higher than 950° C. in a wet atmosphere so as to form an interlayer insulating film 6a of considerably greater oxidation film thickness around the gate electrode 3 than on the gate insulating film 4. The thickness is variable, depending on the temperature condition, but in a range of about 5 to 10 times more, as shown in FIG. 7(c).

(4) The seven steps (6) to (12) in the second embodiment are executed, as shown in FIG. 6(f) to 6(l).

A semiconductor device having the structure in accordance with the present invention was produced by the method consisting of the above-described twelve steps.

FOURTH EMBODIMENT (MANUFACTURING METHOD)

Still another embodiment of a manufacturing method of the present invention will be explained with reference to FIGS. 8(a) to 8(c).

(1) The gate insulating film 4 is first formed on the surface of a P− type semiconductor substrate 1 by a conventional method. Thereafter the gate electrode 3 is formed on the gate insulating film 4 on substrate 1. The gate electrode 3 consists of a polycrystalline silicon layer, a high-melting metal layer such as Mo, W, Ti and Pt, a layer of silicide of high-melting metal such as $MoSi_2$, $WSi_2$ and $TiSi_2$ or a polysilicide layer consisting of a combination of two layers thereof. An n− layer (diffusion layer 2a having a low concentration) is formed on the substrate 1 by implantation of $^{31}P^+$ or $^{75}As^+$ ions while using the gate electrode 3 as a mask. The side wall 6 is formed on the side surface of the gate electrode 3, as shown in FIG. 8(a).

Figure 8:
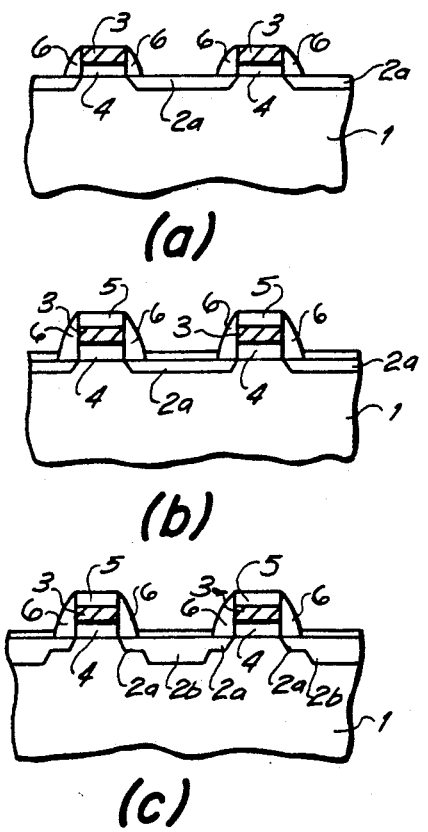

(2) The thus-treated substrate 1 is subjected to oxidation at temperature of not higher than 950° C. in a wet atmosphere so as to form the insulating film 5 of SiO$_2$, as shown in FIG. 8(b). In the same way as in the step (3) in the third embodiment, the insulating film 5 formed over the gate electrode 3 has greater volume of oxidation film thickness than that on the Si substrate 1.

(3) An n+ layer (diffusion layer 2b having a high concentration) is formed on the substrate 1 by the implantation of $^{31}$p+ or $^{75}$As+ ions, as shown in FIG. 8(c).

(4) The three steps (10) to (12) in the second embodiment are executed, as shown in FIG. 6(j) to 6(l).

A semiconductor device having the structure in accordance with the present invention was produced by the method consisting of the above-described six steps.

The manufacturing method of the present invention is different from the conventional manufacturing method in the following points:

(1) The insulating film 5 is formed to a predetermined thickness on the first wiring layer 7 and 3 before forming the side wall 6 in the second and third embodiments, or at least before forming the interlayer insulating film 10 after the formation of the side wall 6 in the fourth embodiment.

(2) When the side wall 6 is formed and interlayer insulating film 10 is etched in the second and third embodiments, or when the interlayer insulating film 10 is etched in the fourth embodiment, etching is carried out so as to leave a final thickness of the insulating film 5 of not less than 500 Å on the first wiring layers 7 and 3.

Although the n channel transistor formed on the P− substrate is described in the above-described embodiments, it goes without saying that the present invention is applicable to a P channel transistor formed on a n type substrate or an n− well in P type substrate and N channel transistor formed on a P− well in N type substrate.

Use of the structure of a semiconductor device according to the present invention brings about the following advantages:

(1) Since it is possible to dispense with provision of the alignment allowance, the interval of the wires of the first wiring layer is reduced, thereby realizing a semiconductor device of a higher density.

(2) Since it is possible to shorten the wiring length of the second layer, the wiring resistance and hence, the wiring delay are reduced.

(3) Since the area of the diffusion layer is reduced, the capacitance of the diffusion layer is reduced and the parasitic capacitance of the second layer is thereby reduced, which leads to realization of speed-up of operation.

(4) The total area of a chip is reduced, thereby increasing the number of effective chips in a wafer, resulting in reduction in cost.

Thus, the semiconductor device according to the present invention is very effective, particularly, for speed-up of operation and reduction in cost.

Quantitatively speaking in the above-described example the length of one side of a cell portion for a 1M bit mask ROM (Read Only Memory) was reduced by as much as (3.2-1.2) μm×1000=2000 μm. This effect enabled reduction in chip area and also reduction in the area of the ROM portion in an integrated circuit containing the ROM. As is well known, in a ROM arrangement, a ROM mask is used to write data to the memory cell which is composed of MOS transistors. The ROM mask is a photoetching mask which is utilized in the manufacturing process.

FIFTH EMBODIMENT (METHOD OF MANUFACTURE)

A method of manufacturing a MOS semiconductor device according to the present invention will be explained with reference to FIGS. 9(a) to 9(d).

The gate insulating film 4 of 400 Å thick was first formed on the P− type silicon substrate 1 having a resistivity of 8 to 12 ohm-cm at 1,000° C. in an O$_2$ atmosphere. Thereafter, a first polycrystalline silicon layer 3a was deposited to a thickness of 1,000 Å, then a molybdenum silicide layer 3b (hereinunder referred to as "MoSi$_2$ layer") was deposited to a thickness of 2,000 Å by sputtering, and a second polycrystalline silicon layer 3c was subsequently deposited to a thickness of 2,000 Å by CVD. These layer depositions were for the purpose of forming the gate electrode 3, as shown in FIG. 9(a). It is also possible to use an MOSi$_2$ layer of 3,000 Å thick with a polycrystalline silicon layer of 2,000 Å thick formed thereon as the gate electrode 3. In other words, a certain conductor with a polycrystalline silicon layer formed thereon is usable as the gate electrode.

A desired patterning was then carried out by photolithography using a positive resist, and the second polycrystalline silicon layer 3c, the MoSi$_2$ layer 3b and the first polycrystalline silicon layer 3a were successively dry etched in that order, as shown in FIG. 9(b). The first polycrystalline silicon layer was etched for about 30 seconds in SF$_6$ and CClF$_5$ gas atmosphere under a pressure of 0.6 Torr at 150 W. The etching time for the second polycrystalline silicon layer 3c was about 20 seconds. The MOSi$_2$ layer 3b was etched for about 1 minute in a CCl+O$_2$ gas atmosphere under a pressure of 6 Pa at 200 W.

Ionized phosphorus P+ was then implanted at a dosage of 8×10$^{12}$ ions/cm$^2$ at an acceleration energy of 30 Kev to form to an N− layer (diffusion layer 2a having a low concentration) while using the gate electrode 3 as a mask.

The thus-treated substrate 1 was further subjected to oxidation for 30 minutes in a wet O$_2$ atmosphere at 950° C. The oxidation changed the sputtered MoSi$_2$ layer 3b into a silicide layer and formed a silicon oxide layer 5 of about 2,500 Å on the second polycrystalline silicon layer 3c from part of the second polycrystalline silicon layer 3c. At this time, a silicon oxide layer of 500 Å was also formed on the silicon substrate 1 by thermal oxidation. The isolation voltage of the silicon oxide layer formed by the oxidation of the MoSi$_2$ layer 3b was about 3mv/cm, but the silicon oxide layer 5 formed over the MoSi$_2$ layer 3b by the oxidation of the second polycrystalline silicon layer 3c was dense and had an insulation voltage of not less than 6 to 8 mv/cm.

A second silicon oxide layer was next deposited to thickness of 5,000 Å by CVD. The CVD was carried out by 30-minute heat treatment in an N$_2$O+CH$_4$ and N$_2$ gaseous atmosphere at 780° C. under a pressure of 200 Pa.

The second silicon oxide layer was dry etched in an RIE mode (Reactive Ion Etching). At this time, the second silicon oxide layer remained at the side wall portion of the first polycrystalline silicon layer 3a, at the MoSi$_2$ layer 3b, at the second polycrystalline silicon layer 3c, and at the first silicon oxide layer, thereby forming the side wall 6. The dry etching had reduced the thickness of the oxide film 5 on the second polycrystalline silicon layer 3c to about 2,000 Å. In this way, by the end of this step, the first polycrystalline silicon layer 3a, the MoSi$_2$ layer 3b and the second polycrystalline silicon layer 3c had been completely covered with the silicon oxide film. Ionized phosphorus P+ was then implanted at a dosage of $1\times10^{16}$ ions/cm$^2$ at an acceleration energy of 30KeV to form the diffusion layer 2b which is to be a source region and/or a drain region. The diffusion layer 2a under the portion 6 was formed before the formation of the portion 6, as shown in FIG. 9(b).

A third silicon oxide film 10 was deposited to a thickness of 2,500 Å by CVD at 760° C. under a pressure of 200 Pa by using SiH$_4$, N$_2$O and N$_2$ gases, as shown in FIG. 9(c).

The portion which needs to contact with the Si substrate 1 was opened while using the positive resist pattern 13 as a mask (the opening portion is called a through hole 9). The portion to be opened may overlap with the pattern of the first polycrystalline silicon layer 3a, the MoSi$_2$ layer 3b and the second polycrystalline silicon layer 3c, as shown in FIG. 9(d). In this way, about 1μm of each alignment allowance between through hole 9 and first polycrystalline silicon 3a, the MoSi layer 3b, and the second polycrystalline silicon 3c is necessary in the prior art. In the above-described method as per the present invention, which allows the overlapping of the through hole with the first polycrystalline silicon layer 3a, the MoSi$_2$ layer 3b and the second polycrystalline silicon layer 3c, further miniaturization of the element is enabled.

The third silicon oxide film 10 was next partially opened by dry etching in a C$_2$ClF$_5$ and N$_2$ gas atmosphere under a pressure of 0.12 Torr at 600 W.

The silicon substrate 1 was exposed by etching, as shown in FIG. 9(d). Since the oxide film formed on the second polycrystalline silicon layer 3c had been etched only to the depth of 500 Å, the oxide film of 1,500 Å thick still remained on the second polycrystalline silicon layer 3c.

The second wiring layer 8 consisting of a third polycrystalline silicon layer or the like was further deposited thereon to a thickness of 2,000 Å. After ionized phosphorus P+ was implanted at a dosage of $6\times10^{15}$ ions/cm$^2$, a desired patterning was carried out by photolithography using a positive resist. The thus-treated substrate 1 was then dry etched for about 20 seconds in a C$_2$ClF$_5$+SF$_6$ gas atmosphere under a pressure of 0.6 Torr at 150 W to form the second wiring layer 8.

Thereafter silicon oxide was deposited in order to insulate the third polycrystalline layer and the wiring material. An opening for keeping contact with the silicon substrate, the second polycrystalline silicon layer and the third polycrystalline silicon layer were formed. A wiring material was deposited in the opening and all over the substrate, and after patterning of wiring material, a device surface protecting film was deposited. Finally, an opening for keeping contact between the wiring material and an external terminal was opened.

Although a part of the uppermost polycrystalline silicon layer 3c of the gate electrode 3 was oxidized to form an SiO$_2$ film in this embodiment, the following method may be adopted in place of this oxidation method:

The first polycrystalline silicon layer 3a is deposited on the gate insulating film 4 to a thickness of 1,000 Å, and subsequently the MoSi$_2$ layer 3b is formed as 2,000 Å thick, then the second polycrystalline silicon layer 3c as 500 Å thick and then the first silicon oxide layer 5 as 3,000 Å thick by CVD in that order. The same effect is obtained by using WSi$_2$, TiSi$_2$, Mo, W, Ti or Pt in place of MoSi$_2$. It is also possible to use another Al, Al-Si, Al-Si-Cu high-melting metal or a silicide of a high-melting metal for the second wiring layer 8 in place of polycrystalline silicon.

As described above, according to this embodiment, the insulation voltage between the gate electrode 3 (consisting of the first polycrystalline silicon layer 3a, the MoSi$_2$ layer 3b and the second polycrystalline silicon layer 3c) on the one hand, and the second wiring layer 8 (consisting of, for example, the third polycrystalline silicon layer) on the other hand, was improved to not less than 8 mv/cm, thereby greatly enhancing the reliability.

The 4M bit mask ROM fabricated from the MOS semiconductor device of this embodiment had a chip area 20% smaller than that of a conventional one.

SIXTH EMBODIMENT

Figure 10:
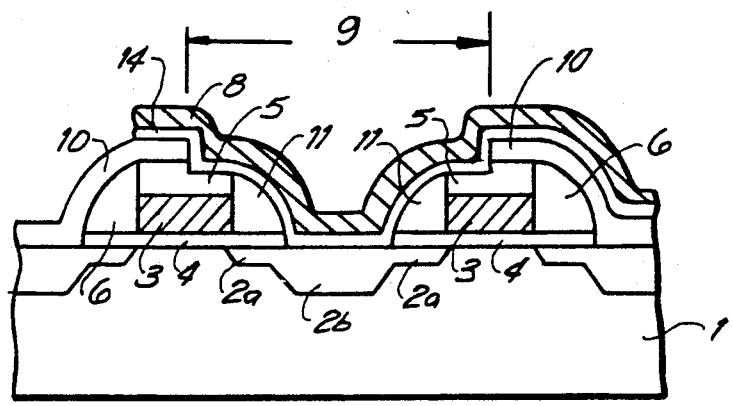
FIG. 10 is a schematic view of another embodiment of a semiconductor device of the present invention.
Figure 11:
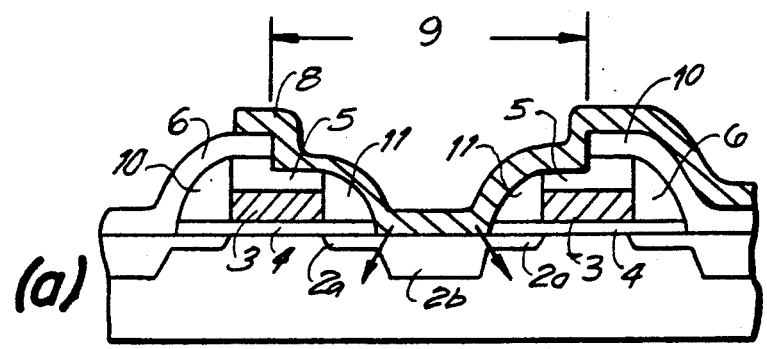
FIGS. 11(a) to 11(c) are explanatory views of leakage caused between a second wiring layer and a substrate.
Figure 11:
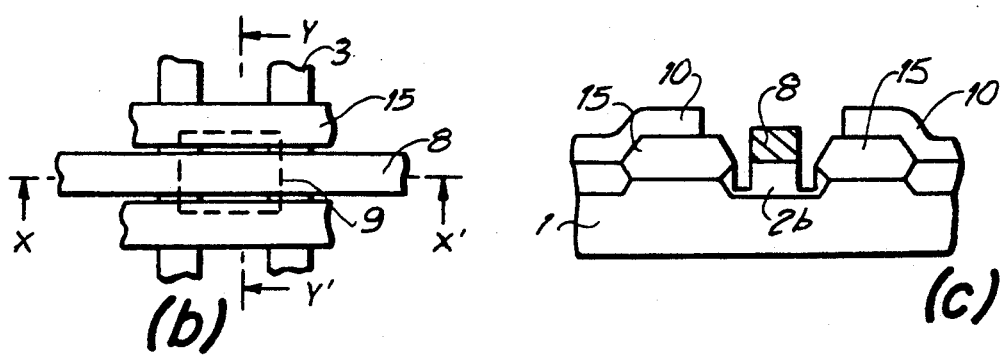

In the first to fifth embodiments, if the second wiring layer 8 consists of a metal such as Al, which is susceptible to react with the silicon of the substrate 1 at a low temperature, there is a danger of the heat treatment causing a leakage between the second wiring layer 8 and the substrate 1. The leakage path would be through the diffusion layer 2a or the boundary between the diffusion layers 2a and 2b, as indicated by the arrows in FIG. 11(a). This sixth embodiment is characterized in that a conductive layer 14 is provided, as shown in FIG. 10, so as to eliminate such a danger. FIGS. 11(a) to 11(c) are explanatory views of the leakage caused between the second wiring layer and the substrate, wherein FIG. 11(a) is a sectional view of FIG. 11(b), taken along the line X-X' of FIG. 11(b) and FIG. 11(c) is a sectional view of FIG. 11(b) taken along the line Y-Y' of FIG. 11(b).

The conductive layer 14 consists of a high-melting metal such as Mo, W. Ti and Pt, a silicide thereof, a nitride thereof or a combination of at least two layers thereof. The conductive layer 14 is formed at least at the portion of a substrate at which the second wiring layer 8 comes into contact with the silicon substrate 1. It goes without saying that the conductive layer 14 is formed on the entire undersurface of the second wiring layer 8.

The conductive layer 14 both prevents the second wiring layer 8 from communicating with the substrate 1 and lowers the contact resistance between the second wiring layer 8 and the substrate 1.

Furthermore, if one uses for the conductive layer 14, a material having a large selectivity with respect to the second wiring layer 8 at the time of etching, for example, if the second wiring layer 8 consists of polycrystalline silicon and the conductive layer 14 consists of MoSi$_2$, any undesirable effects which would otherwise be indicated in FIGS. 11(b) and 11(c) are in fact not produced.

More specifically, according to this sixth embodiment, even when the wiring width of the second wiring layer 8 is smaller than the width of the exposed surface of the silicon substrate 1 at the opening portion 9, there is no danger of the silicon substrate 1 being etched when the second wiring layer 8 is etched. Etching of the substrate would result in the formation of a groove which might break the wire formed thereon, as shown in FIGS. 11(b) and 11(c). Characteristically of this sixth embodiment, a device isolation region 15 is provided.

The conductive layer 14 is formed by executing the following step after the step shown in FIG. 6(k), thereby obtaining the structure shown in FIG. 10.

The conductive layer 14 or the multi-layer conductive layer 14 consists of a high-melting metal such as Mo, W, Ti and Pt, a silicide thereof, a nitride thereof or a combination of at least two layers thereof is formed by sputtering or CVD and the second wiring layer 8 is formed thereon.

In order to form the conductive layer 14 on the entire undersurface of the second wiring layer 8, the conductive layer 14 and the second wiring layer 8 are consecutively formed After forming a photoresist pattern, the second wiring layer 8 and the conductive layer 14 are etched either simultaneously or at two stages. At this time, the resistance to electromigration is simultaneously achieved.

On the other hand, in order to form the conductive layer 14 only between the second wiring layer 8 and the Si surface of the diffusion layer 2, the conductive layer 14 is first formed on the entire surface in the state shown in FIG. 6(k), and only the silicon surface is changed into a silicide by heat treatment and then selectively etched by using Ti or the like so as to form the silicide film only on the Si surface. In order to form the conductive layer 14 only in the vicinity of the portion between the second wiring layer 8 and the Si surface of the diffusion layer 2, after the conductive layer 14 is formed on the entire surface in the state shown in FIG. 6(k), a photoresist pattern is formed only at the necessary portion. After the conductive layer 14 is etched and the photoresist pattern is removed, the second wiring layer 8 is formed by a conventional method.

A mask ROM and an integrated circuit containing the mask ROM were produced using this embodiment.

Mask ROMs and integrated circuits containing the mask ROMs are preferred applications of the several embodiments hereinbefore described. However, the invention may be advantageously practiced in other applications, for example in integrated circuit applications in general, and particularly in large scale IC applications, where some of the aforedescribed advantages may be utilized to great effect. These advantages are reduction in wiring length and wiring materials, and hence in wiring resistance, reduction in parasitic capacitance, reduction in chip area, speed-up of operation, and reduction in cost.

To achieve the objects of the invention, the opening portion 9 in a semiconductor device according to the present invention is provided in such a manner as to extend to a position above the first wiring layers 7 and 3 so as to make an allowance for the alignment deviation and prevent the increase in the contact resistance.

Figure 2:
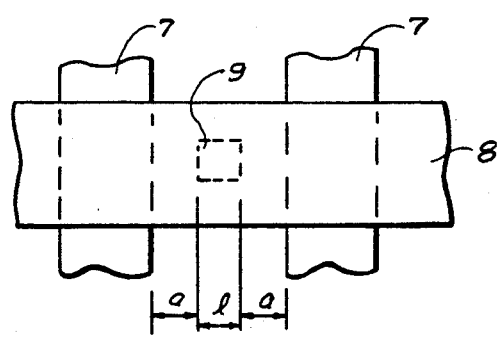
FIG. 2 is a plan view of the contact portion of the conventional semiconductor device shown in FIG. 1.
Figure 3:
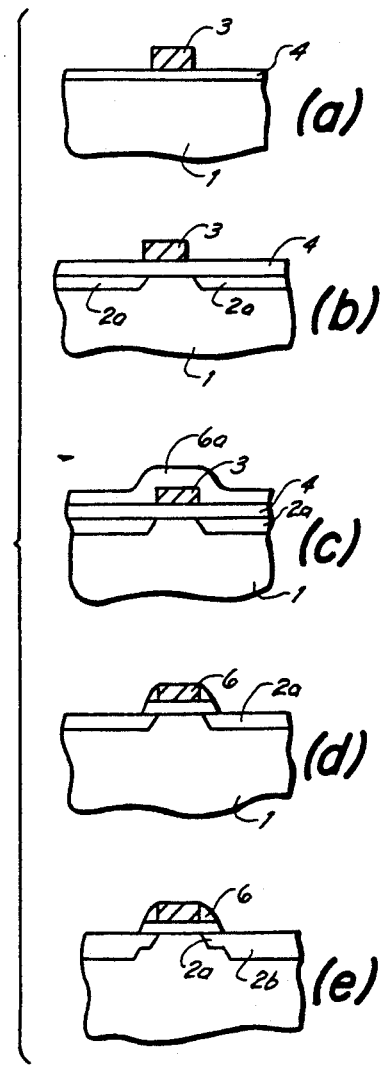
FIGS. 3(a) to 3(e) are explanatory views of a conventional manufacturing process of a semiconductor having an LD structure.

In a conventional method, the interval of the first wiring layers of 7 and 3 polysilicon or the like is $l+2a$, as shown in FIG. 2 wherein l represents the width of the opening portion between the first wiring layers 7 and 3 of polysilicon or the like and a is the alignment allowance.

In the method of the present invention, however, no alignment allowance is necessary, and the wiring interval may be the minimum which is only restricted by fabrication necessity, as shown in FIG. 5.

If it is assumed that the width of the first wiring layer 7, 3 of polysilicon or the like is 1.2 μm, the interval of the wires is 1.2 μm, the alignment allowance a is 1.0 μm and l 1.2 μm, the wiring interval width is $$l+2a=(1.2+1.0+2)\mu m=3.2\mu m$$

by a conventional method; and 1.2 μm by the method of the present invention. Thus, according to the present invention, the wiring interval is reduced to less than half that realized by a conventional method.

A semiconductor device according to the present invention having the above-described structure can be made with reduced chip area. Hence, reduction of the area of the diffusion layer for the source or drain electrodes is enabled. The latter reduction is in proportion to the reduction of the chip area, thereby reducing the parasitic capacitance. In the same way, the wiring length of a second layer is shortened in proportion to the reduction of the chip area, so that it is possible to reduce the wiring resistance and propagation delay. Thus, a semiconductor device according to the present invention can cope with the demand for speed-up of operation and reduction in costs.

In a semiconductor device according to the present invention, when polysilicon, a high-melting metal such as Mo, W, Ti and Pt, a silicide of a high-melting metal such as $MoSi_2$, $WSi_2$, and $TiSi_2$, or a polysilicide of two layers thereof is used for a gate electrode and a first wiring layer, breakdown of an insulating layer is apt to be caused due to the uneven surface of such conductive layers. To prevent this, the thickness of the insulating film between the two A layers is set at not less than 500 Å at the thinnest portion.

To recapitulate quantitatively stated attributes of the inventive embodiments, it will be recalled that by practicing the present invention the wiring interval width of the inventive semi-conductor device is reduced by better than 50% vis-a-vis that of the conventional device. In consequence, the length of one side of a cell portion of a mask ROM could be reduced by 2,000 μm; the chip area of a mask ROM by 20%.

Thus the semiconductor device according to the present invention is very effective, particularly for miniaturization, for speed-up of operation and for reduction in cost.

It will thus be seen that the objects set forth above, among those made apparent from the preceding description, are efficiently attained.

Figure 9:
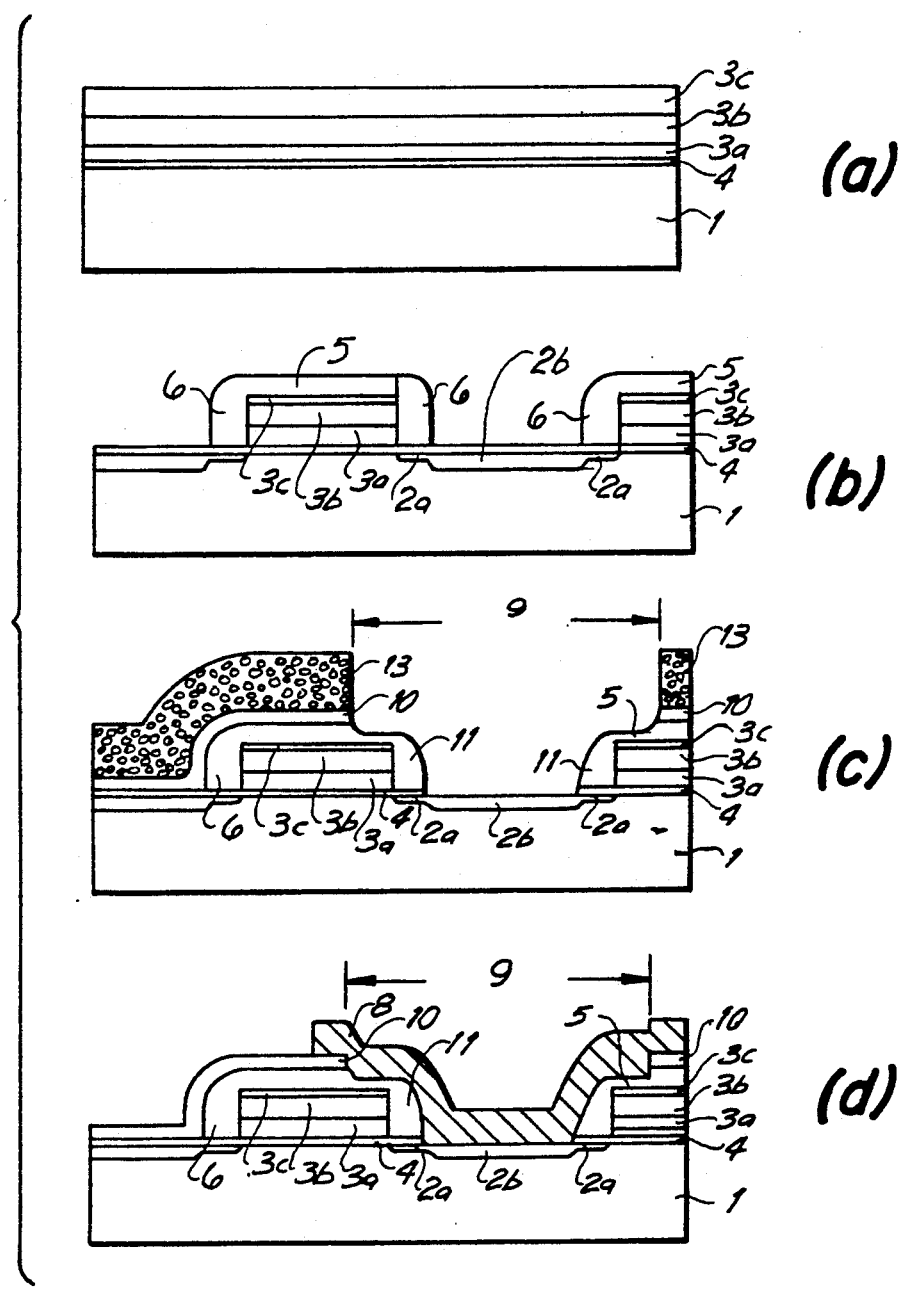

In the preceding description there have been indicated modifications and changes in the embodiments described in greater detail. For example, some of the method-of-manufacturing embodiments consist in changes of some of the steps, together with retention of other steps, of the second embodiment (described with reference to FIG. 6). Other disclosed changes pertain to the oxidation steps call for in the principal version of the fifth embodiment (FIG. 9). Still other suggested changes involve inversion of conductivity type (N to P and vice-versa) for the substrate and for the channel transistor. These and other changes may be made in carrying out the above constructions and methods without departing from the spirit and scope of the invention. Therefore it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor device comprising:
   a semiconductor substrate including a semiconductor substrate surface;
   a first insulating film carried on the semiconductor substrate and including a first first insulating film and a second first insulating film positioned along the semiconductor substrate surface;
   a first wiring layer having lesser width than the first insulating film and carried on the first insulating film and including a first first wiring layer and a second first wiring layer carried respectively on the corresponding first first insulating film and second first insulating film;
   an interlayer insulating film overlying and enclosing the first wiring layer and overlying the first insulating film, the interlayer insulating film having:
      a first top portion which overlies the first wiring layer and which includes a first first top portion and a second first top portion; and
      a first pair of side wall portions overlying the first first insulating film and on either side of the first first wiring layer and a second pair of side wall portions overlying the second first insulating film and on either side of the second first wiring layer, each side wall portion having progressively and continuously increasing width in progressing towards the semiconductor substrate;
   a second wiring layer which extends from overlying part of the first top portion of the interlayer insulating film to and in contact with an exposed portion of the substrate adjacent the first insulating film;
   a first diffusion layer-region in the surface of the semiconductor substrate at least intermediate the first first insulating film and the second first insulating film and contacted by the second wiring layer; and
   a second diffusion-layer region in the surface of the semiconductor substrate spaced from the first diffusion-layer region by at least a portion of the width of said first first insulating film;
   wherein the first first top portion and second first top portion of said interlayer insulating film respectively overlie the corresponding first first wiring layer and second first wiring layer; and
   wherein said interlayer insulating film further includes a second top portion having
      a first region which overlies said second diffusion-layer region, one of the first pair of side wall portions of the interlayer insulating film overlying the portion of the first first insulating film adjacent the second diffusion-layer region and a portion of the first first top portion overlying that portion of said first first wiring layer adjacent said second diffusion-layer, and
      a second region which overlies a portion of the second first top portion away from the first diffusion-layer region, said second wiring layer extending over said second top portion.

2. The semiconductor device according to claim 1, wherein the first wiring layer is formed into a gate electrode.

3. The semiconductor device according to claim 1, wherein the first wiring layer comprises of a layer of polycrystalline silicon.

4. The semiconductor device according to claim 1, wherein the first wiring layer comprises a layer of a high-melting metal selected from the group consisting of Mo, W, Ti and Pt.

5. The semiconductor device according to claim 1, wherein the first wiring layer comprises a layer of a silicide of a high-melting metal selected from the group consisting of Mo, W, Ti, and Pt.

6. The semiconductor device according to claim 1, wherein the first wiring layer comprises a multi-layer film, the individual film layers of the latter multi-layer film being selected from the group consisting of polycrystalline silicon, Mo, W, Ti, Pt, a silicide of Mo, a silicide of W, a silicide of Ti and a silicide of Pt.

7. The semiconductor device according to claim 2, wherein the first wiring layer comprises a layer of a high-melting metal selected from the group consisting of Mo, W, Ti and Pt.

8. The semiconductor device according to claim 2, wherein the first wiring layer comprises a layer of a silicide of a high-melting metal selected from the group consisting of Mo, W, Ti and Pt.

9. The semiconductor device according to claim 2, wherein the first wiring layer comprises a multi-layer film, the individual film layers of the multi-layer film being selected from the group consisting of polycrystalline silicon, Mo, W, Ti, Pt, a silicide of Mo, a silicide of W, a silicide of Ti and a silicide of Pt.

10. The semiconductor device according to claim 1, wherein the first diffusion layer region includes a high concentration region in contact with the second wiring layer and more than a majority of a low concentration region underlying portions of the first insulating film not covered by the first wiring layer.

11. The semiconductor device according to claim 1, wherein the first diffusion layer region includes a high concentration region in contact with the second wiring layer and more than a majority of a low concentration region underlying portions of the first insulating film not covered by the first wiring layer.

12. The semiconductor device according to claim 1, wherein the thickness of the interlayer insulating film is at least equal to or greater than 500 Å in the region between the first and second wiring layers.

13. The semiconductor device according to claim 2, wherein the thickness of the interlayer insulating film is at least equal to or greater than 500 Å in the region between the first and second wiring layers.

14. The semiconductor device according to claim 1, wherein the first and second regions of the second top portion of the interlayer insulating film are spaced to define an opening therethrough for receipt of the second wiring layer, said opening overlying portions of the first and second first wiring layers and the first diffusion-layer region therebetween.

15. The semiconductor device according to claim 14, wherein the first diffusion layer region includes a high concentration region in contact with the second wiring layer and more than a majority of a low concentration region underlying portions of the first insulating film not covered by the first wiring layer.

16. The semiconductor device according to claim 14, wherein the thickness of the interlayer insulating film is at least equal to or greater than 500 Å in the region between the first and second wiring layers.

17. The semiconductor device according to claim 1;
   wherein said first insulating film further includes a third first insulating film positioned away from said first first insulating film along the semiconductor substrate surface by the width of at least a portion of the second diffusion layer; and wherein said first wiring layer further includes a third first wiring layer carried on said third first insulating film;

further including a third diffusion-layer region in the surface of the semiconductor substrate surface spaced from the second diffusion-layer region by at least a portion of the width of the third first insulating film;

wherein said interlayer insulating film further includes a third first top and a third pair of side wall portions overlying said third first insulating film and positioned on either side of said third first wiring layer;

wherein said first region of said second top portion overlying one of the third pair of side wall portions of the interlayer insulating film, the portion of the first insulating film adjacent the second diffusion-layer region and a portion of the third first top portion overlying the portion of the third first wiring portion adjacent said second diffusion-layer region; and wherein said second wiring layer extending from over said second first top portion to over the remaining portion of the third first top portion to over the remaining one of the third pair of side wall portions and being in contact with the third diffusion-layer region;

whereby two semiconductor devices are defined on said substrate.

18. The semiconductor device according to claim 17, wherein the first diffusion-layer region and third diffusion layer region each include a high concentration region in contact with the second wiring layer and a low concentration region underlying portions of the first insulating film not covered by the first wiring layer.

19. The semiconductor device according to claim 17, wherein the thickness of the interlayer insulating film at the thinnest portion thereof between the first and the second wiring layer is at least equal to or greater than 500 Å.

20. The semiconductor device according to claim 17, wherein for each such semiconductor device the first wiring layer comprises a layer of polycrystalline silicon.

21. The semiconductor device according to claim 17, wherein for each such semiconductor device the first wiring layer comprises a layer of a high-melting metal selected from the group consisting of Mo, W, Ti and Pt.

22. The semiconductor device according to claim 17, wherein for each such semiconductor device the first wiring layer comprise a layer of a silicide of a high-melting metal selected from the group consisting of Mo, W, Ti, and Pt.

23. The semiconductor device according to claim 17, wherein for each such semiconductor device the first wiring layer comprises a multi-layer film, the individual film layers of the multi-layer film being selected from the group consisting of polycrystalline silicon, Mo, W, Ti, Pt, a silicide of Mo, a silicide of W, a silicide of Ti and a silicide of Pt.

24. A semiconductor device comprising:
a semiconductor substrate having a surface, a first diffusion-layer region and a second diffusion layer region, said first diffusion-layer region and second diffusion-layer region formed in the surface of the semiconductor substrate;
a first insulating film carried on the semiconductor substrate at least adjacent the first diffusion-layer region and including a first first insulating film and a second first insulating film positioned along the surface of the semiconductor substrate with at least a portion of the first diffusion-layer region therebetween;
a first wiring layer having a gate-defining portion narrower than the first insulating film and carried on the first insulating film and including a first first wiring layer and a second first wiring layer carried respectively on the corresponding first first insulating film and the second first insulating film;
an interlayer insulating film overlying the first first wiring layer, second first wiring layer, first first insulating film, second first insulating film and second diffusion region and including a plurality of regions, each of the plurality of regions starting from a point overlying the first insulating film and extending to about the boundary between the first insulating film and one of the diffusion regions, each of the plurality of regions resembling in cross-section a sector of a circle which increases progressively in thickness as the region extends from said point to about said boundary; and
a second wiring layer overlying the interlayer insulating film and in contact with that portion of the first diffusion layer which is between those boundaries not covered by said interlayer insulating film;
wherein said second diffusion layer region is positioned away from said first diffusion-layer region by at least a portion of the first first insulating film.

25. The semiconductor device according to claim 24, wherein the first wiring layer comprises of a layer of polycrystalline silicon.

26. The semiconductor device according to claim 24, wherein the first wiring layer comprises a layer of a high-melting metal selected from the group consisting of Mo, W, Ti and Pt.

27. The semiconductor device according to claim 28, wherein the first wiring layer comprises a layer of a silicide of a high-melting metal selected from the group consisting of Mo, W, Ti, and Pt.

28. The semiconductor device according to claim 24, wherein the first wiring layer comprises a multi-layer film, the individual film layers of the multi-layer film being selected from the group consisting of polycrystalline silicon, Mo, W, Ti, Pt, a silicide of Mo, a silicide of W, a silicide of Ti and a silicide of Pt.

29. The semiconductor device according to claim 24, wherein the diffusion layer includes a high concentration region in contact with the second wiring layer and more than a majority of a low concentration region underlying portions of the first insulating film not covered by the first wiring layer.

30. The semiconductor device according to claim 24, wherein the thickness of the interlayer insulating film is at least equal to or greater than 500 Å in the region between the first and second wiring layers.

31. The semiconductor device according to claim 24, wherein the plurality of regions of the interlayer insulating film respectively overlie portions of the first and second first wiring layers.

32. The semiconductor device according to claim 24, wherein the first wiring layer comprises a layer of polycrystalline silicon.

33. The semiconductor device according to claim 24, wherein the first wiring layer comprises a layer of a high-melting metal selected from the group consisting of Mo, W, Ti and Pt.

34. The semiconductor device according to claim 24, wherein the first wiring layer comprises a layer of a silicide of a high-melting metal selected from the group consisting of Mo, W, Ti, and Pt.

35. The semiconductor device according to claim 24, wherein the first wiring layer comprises a multi-layer film, the individual film layers of the multi-layer film being selected from the group consisting of polycrystalline silicon, Mo, W, Ti, Pt, a silicide of Mo, a silicide of W, a silicide of Ti and a silicide of Pt.

36. The semiconductor device according to claim 29, wherein the diffusion layers each include a high concentration region in contact with the second wiring layer and more than a majority of a low concentration region underlying portions of the first insulating film not covered by the first wiring layer.

37. The semiconductor device according to claim 24, wherein the thickness of the interlayer insulating film is at least equal to or greater than 500 Å in the region between the first and second wiring layers.

38. The semiconductor device according to claim 31, wherein:
said first insulating film further includes a third first insulating film positioned along the semiconductor substrate surface with at least a portion of the second diffusion layer therebetween;
said first wiring layer further includes a third first wiring layer carried on said third first insulating film;
a third diffusion-layer region in the surface of the semiconductor substrate is spaced from the second diffusion-layer region by at least a portion of the width of the third first insulating film;
said interlayer insulating film further overlays said third first insulating film and includes an additional one of the plurality of regions extending from a point overlying the third first insulating film to about the boundary between the third first insulating film and the third diffusion-layer region; and
said second wiring layer is in contact with the third diffusion-layer region.

39. The semiconductor device according to claim 38, wherein the diffusion layer regions each include a high concentration region in contact with the second wiring layer and more than a majority of a low concentration region underlying portions of the first insulating film not covered by the first wiring layer.

40. A semiconductor device comprising:
a diffusion-layer region formed in the surface thereof, said diffusion-layer region having a central portion of a high concentration and peripheral portions of a low concentration;
a first insulating film extending on the surface of the substrate from overlying a low concentration portion of the diffusion-layer region to beyond said diffusion-layer region;
a first wiring layer lying on and surrounded on its top, bottom and sides by said first insulating film, one side of said first wiring layer essentially defining the boundary of said low concentration portion of the diffusion-layer region;
an interlayer insulating film overlying a portion of said first insulating film extending away from the diffusion-layer region from a point spaced from said boundary; and
a second wiring layer overlying the interlayer insulating film and the first insulating film and in contact with the surface of the substrate essentially in the portion of high concentration of the diffusion-layer region.

41. The semiconductor device according to claim 40, wherein the first wiring layer is comprised of one or more film layers comprised of one or more materials selected from the group consisting of polycrystalline silicon, Mo, W. Ti, Pt, a silicide of Mo, a silicide of W, a silicide of Ti and a silicide of Pt.

42. The semiconductor device according to claim 40, wherein the thickness of the insulating film between the first and second wiring layers is at least equal to or greater than 500 Å.

* * * * *